(12) United States Patent
Geng et al.

(10) Patent No.: US 12,089,405 B2
(45) Date of Patent: Sep. 10, 2024

(54) THREE-DIMENSIONAL MEMORY DEVICES WITH CHANNEL STRUCTURES HAVING PLUM BLOSSOM SHAPE

(71) Applicant: YANGTZE MEMORY TECHNOLOGIES CO., LTD., Wuhan (CN)

(72) Inventors: Wanbo Geng, Wuhan (CN); Lei Xue, Wuhan (CN); Xiaoxin Liu, Wuhan (CN); Tingting Gao, Wuhan (CN); Weihua Cheng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 850 days.

(21) Appl. No.: 17/085,334

(22) Filed: Oct. 30, 2020

(65) Prior Publication Data

US 2022/0013536 A1 Jan. 13, 2022

Related U.S. Application Data

(63) Continuation of application No. PCT/CN2020/100870, filed on Jul. 8, 2020.

(51) Int. Cl.
*H10B 43/27* (2023.01)
*H10B 43/10* (2023.01)
*H10B 43/35* (2023.01)

(52) U.S. Cl.
CPC ............ *H10B 43/27* (2023.02); *H10B 43/10* (2023.02)

(58) Field of Classification Search
CPC .................... H10B 43/20–27; H10B 43/10
See application file for complete search history.

(56) References Cited

U.S. PATENT DOCUMENTS

| 9,406,692 B2 * | 8/2016 | Lee ........................ H10B 43/35 |
| 10,103,165 B2 * | 10/2018 | Son ........................ H10B 43/30 |
| 10,431,594 B2 | 10/2019 | Kim |
| 10,756,109 B2 * | 8/2020 | Uchida .................. G11C 5/063 |
| 2013/0140623 A1 | 6/2013 | Lee et al. |

(Continued)

FOREIGN PATENT DOCUMENTS

| CN | 104766865 A | 7/2015 |
| CN | 107623006 A | 1/2018 |

(Continued)

OTHER PUBLICATIONS

International Search Report issued in corresponding International Application No. PCT/CN2020/100870, mailed Apr. 12, 2021, 4 pages.

(Continued)

*Primary Examiner* — Walter H Swanson
*Assistant Examiner* — Jacob T Nelson
(74) *Attorney, Agent, or Firm* — BAYES PLLC

(57) ABSTRACT

Embodiments of three-dimensional (3D) memory devices and methods for forming the same are disclosed. In an example, a 3D memory device includes a substrate and a channel structure extending vertically above the substrate and having a plum blossom shape including a plurality of petals in a plan view. The channel structure includes a plurality of semiconductor channels in the plurality of petals, respectively.

20 Claims, 12 Drawing Sheets

(56) References Cited

U.S. PATENT DOCUMENTS

| | | | |
|---|---|---|---|
| 2013/0207225 A1* | 8/2013 | Sakui | H01L 29/7889 257/E27.081 |
| 2014/0054670 A1 | 2/2014 | Lee et al. | |
| 2016/0071876 A1 | 3/2016 | Mizuno et al. | |
| 2018/0019257 A1 | 1/2018 | Son et al. | |
| 2020/0035696 A1 | 1/2020 | Zhu | |
| 2020/0098767 A1* | 3/2020 | Morooka | H01L 29/40117 |
| 2020/0098774 A1 | 3/2020 | Yeh et al. | |
| 2020/0118953 A1 | 4/2020 | Yu et al. | |

FOREIGN PATENT DOCUMENTS

| | | |
|---|---|---|
| CN | 107919362 A | 4/2018 |
| CN | 108231781 A | 6/2018 |
| CN | 110520990 A | 11/2019 |
| CN | 110707085 A | 1/2020 |
| CN | 110957327 A | 4/2020 |
| CN | 111146206 A | 5/2020 |
| TW | 201616725 A | 5/2016 |
| TW | 202011575 A | 3/2020 |
| TW | 202013689 A | 4/2020 |

OTHER PUBLICATIONS

International Search Report issued in corresponding International Application No. PCT/CN2020/100868, mailed April 9, 2021, 5 pages.

\* cited by examiner

THREE-DIMENSIONAL MEMORY DEVICES WITH CHANNEL STRUCTURES HAVING PLUM BLOSSOM SHAPE

CROSS-REFERENCE TO RELATED APPLICATIONS

This application is continuation of International Application No. PCT/CN2020/100870, filed on Jul. 8, 2020, entitled "THREE-DIMENSIONAL MEMORY DEVICES WITH CHANNEL STRUCTURES HAVING PLUM BLOSSOM SHAPE," which is hereby incorporated by reference in its entirety. This application is also related to U.S. application Ser. No. 17/085,366, filed on Oct. 30, 2020, entitled "METHODS FOR FORMING THREE-DIMENSIONAL MEMORY DEVICES WITH CHANNEL STRUCTURES HAVING PLUM BLOSSOM SHAPE," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a substrate and a channel structure extending vertically above the substrate and having a plum blossom shape including a plurality of petals in a plan view. The channel structure includes a plurality of semiconductor channels in the plurality of petals, respectively.

In another example, a 3D memory device includes a continuous blocking layer, a continuous charge trapping layer, and a continuous tunneling layer each following a plum blossom shape from outside to inside in this order in a plan view. The 3D memory device also includes a plurality of separate semiconductor channels each disposed over part of the continuous tunneling layer at a respective apex of the plum blossom shape.

In still another example, a 3D memory device includes a substrate and a channel structure extending vertically above the substrate and including more than two memory cells in a same plane in a plan view. Each of the memory cells includes a separate semiconductor channel, and the memory cells share a continuous blocking layer, a continuous charge trapping layer, and a continuous tunneling layer from outside to inside in this order in the plan view.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
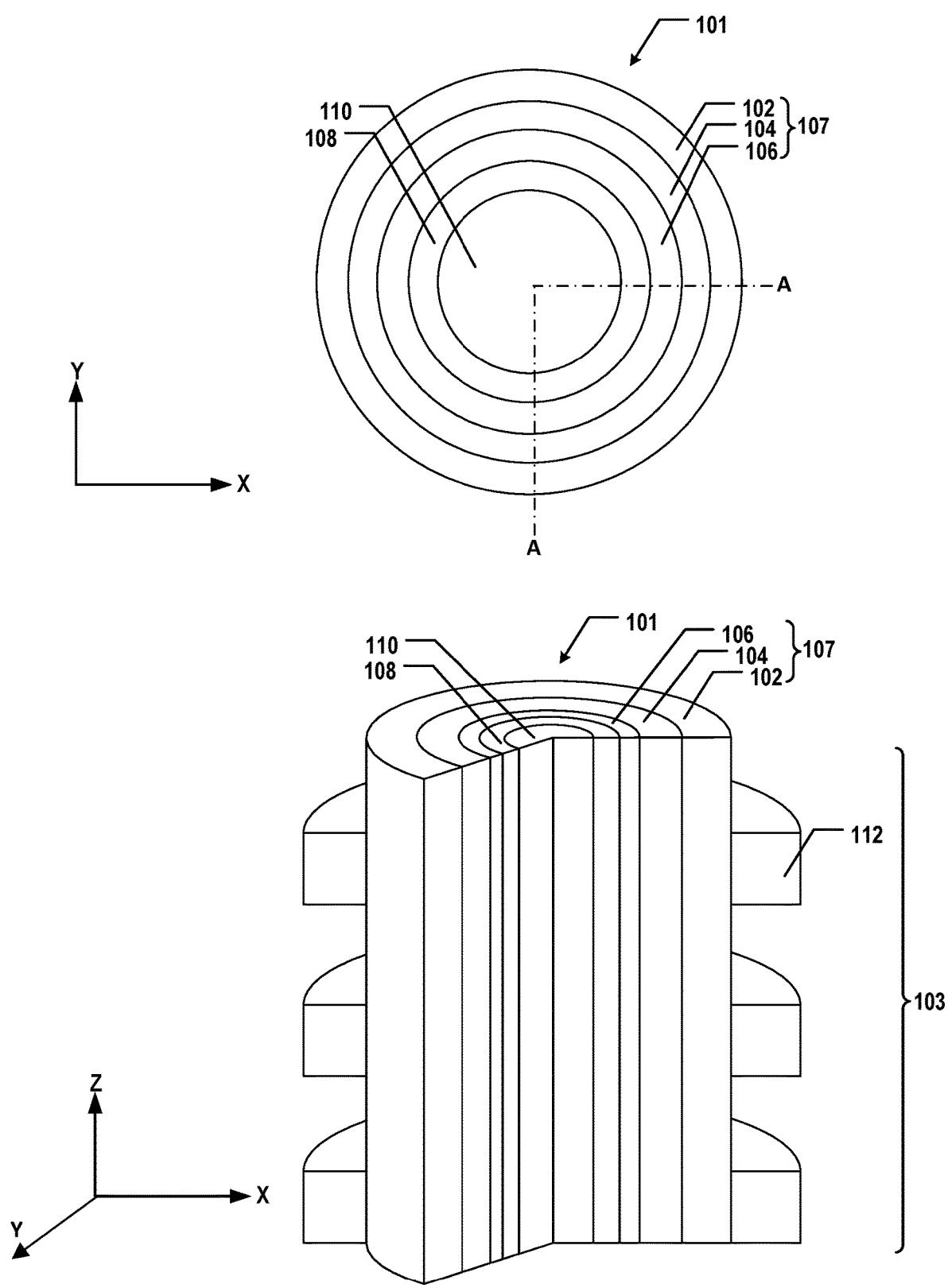
FIG. 1 illustrates a plan view of a cross-section and a top perspective view of another cross-section of a 3D memory device having a circular channel structure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with memory cells that can be arranged vertically on a laterally-oriented substrate so that the number of memory cells can be scaled up in the vertical direction with respect to the substrate. As used herein, the term "vertical/vertically" means nominally perpendicular to the lateral surface of a substrate.

In conventional 3D NAND Flash memory devices, the memory cells are arranged in different planes of an array of circular channel structures. For example, FIG. 1 illustrates a plan view of a cross-section and a top perspective view of another cross-section in the AA plane of a 3D memory device 100 having a circular channel structure 101. Channel structure 101 extends vertically above a substrate (not shown) in the z-direction. It is noted that x- y-, and z-axes are included in FIG. 1 to further illustrate the spatial relationships of the components in 3D memory device 100. The x- and y-axes are orthogonal in the x-y plane, which is parallel to the wafer surface. The substrate includes two lateral surfaces extending laterally in the x-y plane (i.e., in the lateral direction): a top surface on the front side of the wafer, and a bottom surface on the backside opposite to the front side of the wafer. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device in the z-direction (the vertical direction perpendicular to the x-y plane) when the substrate is positioned in the lowest plane of the semiconductor device in the z-direction. The same notion for describing the spatial relationships is applied throughout the present disclosure.

3D memory device 100 also includes a memory stack 103 through which channel structure 101 extends vertically. Memory stack 103 includes multiple gate lines 112 in different planes in the z-direction abutting channel structure 101 to form multiple memory cells in different planes. Each gate line 112 extends laterally (e.g., in the x-direction) to become the word lines of 3D memory device 100. Memory stack 103 also includes multiple gate-to-gate dielectric layers (not shown) between adjacent gate lines 112. In other words, memory stack 103 includes interleaved gate lines 112 and gate-to-gate dielectric layers. Circular channel structure 101 includes concentric circles forming a memory film 107, a semiconductor channel 108, and a capping layer 110 from outside to inside in the plan view. Memory film 107 includes a blocking layer 102, a charge trapping layer 104, and a tunneling layer 106 from outside to inside in the plan view. Each gate line 112 and corresponding parts of blocking layer 102, charge trapping layer 104, tunneling layer 106, and semiconductor channel 108 in the same plane form a respective memory cell.

In this design, the memory cell density can be increased by increasing the density of channel structures 101 in the x-y plane and the number of gate lines 112 in the z-direction (e.g., the number of levels/layers of memory stack 103), while the number of memory cells of each channel structure 101 in the same plane is fixed, i.e., only one memory cell. However, as the number of cell layers/memory stack levels keeps increasing, e.g., exceeding 96, managing the fundamental trade-offs among etch profile control, size uniformity, and productivity is becoming increasingly challenging. For example, issues, such as channel hole step etching and interconnects for channel hole double pattern, have encountered significant challenges due to the increased channel structure density and/or memory stack level.

Various embodiments in accordance with the present disclosure provide 3D memory devices with channel structures having a plum blossom shape to increase the memory cell density without increasing the channel structure density or the memory stack level. The plum blossom shape can have more than two petals (e.g., 3, 4, 5, etc.) in which separate semiconductor channels are formed, respectively, such that in the same plane, more than two memory cells can be formed for each channel structure having the plum blossom shape. Due to the "angle effect," the thickness of a thin film deposited along the sidewalls of a channel hole having a plum blossom shape can become larger at each apex than at the edges of the plum blossom shape. By utilizing the thin film thickness distribution caused by the angle effect, a semiconductor channel-splitting process can separate a continuous semiconductor channel layer into multiple discrete semiconductor channels either with or without an etch stop layer. As a result, the memory cell density per unit area in the same plane can be increased to resolve various issues described above, such as channel hole step etching and interconnects for channel hole double pattern.

Figure 2:
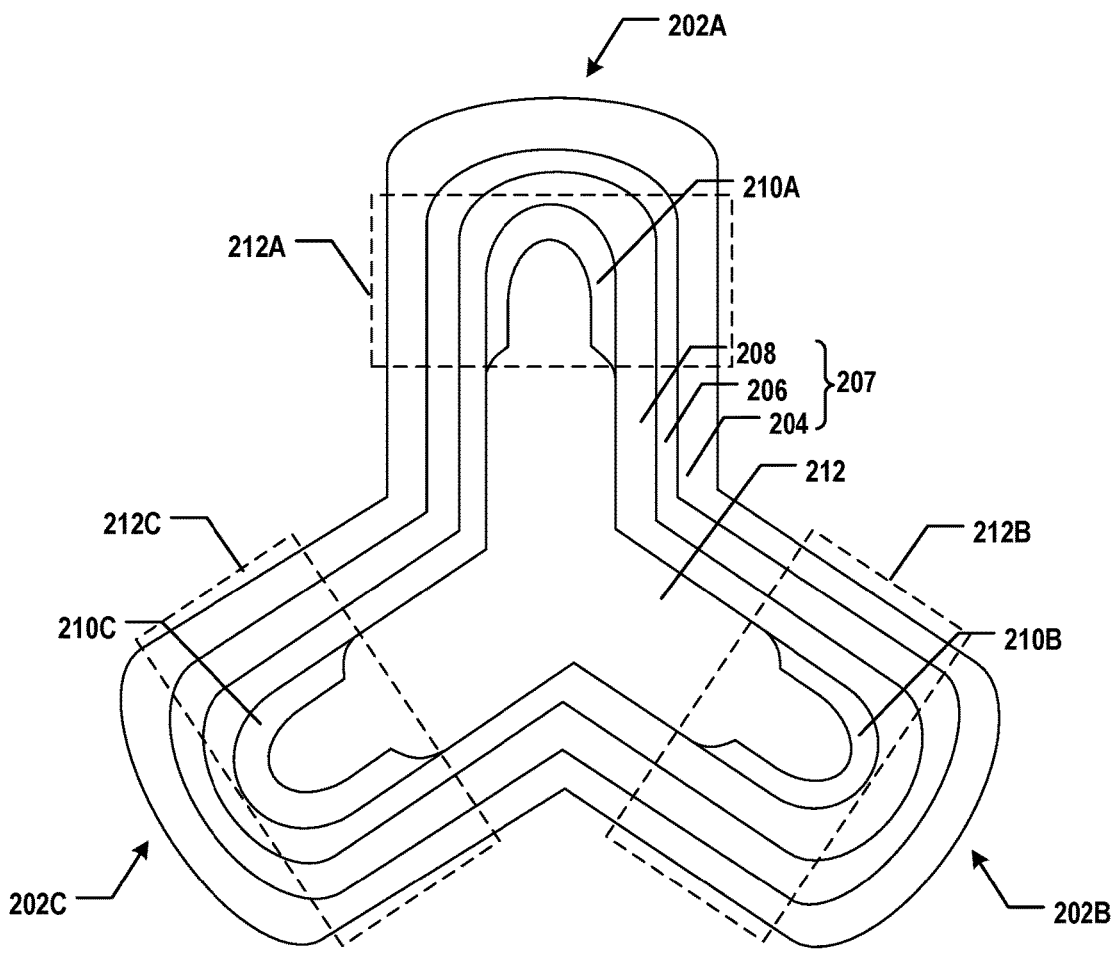
FIG. 2 illustrates a plan view of a cross-section of an exemplary channel structure having a plum blossom shape, according to some embodiments of the present disclosure.
Figure 2:

FIG. 2 illustrates a plan view of a cross-section of an exemplary channel structure 200 having a plum blossom shape, according to some embodiments of the present disclosure. In some embodiments, FIG. 2 shows the plan view of the top surface of channel structure 200 or an upper plane close to the top surface of channel structure 200. It is understood that although not shown in the plan view, the substrate and memory stack 103 having interleaved gate lines 112 and gate-to-gate dielectric layers described above with respect to 3D memory device 100 in FIG. 1 may be similarly applied to a 3D memory device having channel structure 200. For example, a 3D memory device may include a memory stack having interleaved gate lines (word lines) and gate-to-gate dielectric layers above a substrate, and an array of channel structures 200 each extending vertically through the memory stack above the substrate and having a plum blossom shape as described below in detail. The substrate (not shown) can include silicon (e.g., single crystalline silicon), silicon germanium (SiGe), gallium arsenide (GaAs), germanium (Ge), silicon on insulator (SOI), or any other suitable materials. In some embodiments, the substrate is a thinned substrate (e.g., a semiconductor layer), which was thinned from a normal thickness by grinding, wet/dry etching, chemical mechanical polishing (CMP), or any combination thereof.

As shown in FIG. 2, different from the conventional circular channel structures, channel structure 200 has a plum blossom shape, which has three petals 202A, 202B, and 202C in the plan view, according to some embodiments. In some embodiments, each petal 202A, 202B, or 202C has nominally the same size and shape. In some embodiments, adjacent petals 202A, 202B, and 202C are tilted by nominally the same angle, for example, 120°. The plum blossom shape can have three apices in a respective petal 202A, 202B, or 202C. Each apex of respective petal 202A, 202B, or 202C of the plum blossom shape can be curved, as shown in FIG. 2. It is understood that in some examples, each apex may be in any other suitable shape as well. The plum blossom shape can also include edges connecting the apices. In other words, each apex is a convex corner where two edges meet, according to some embodiments.

Channel structure 200 can include a memory film 207 following the plum blossom shape and formed along the sidewalls of the channel hole of channel structure 200. In some embodiments, a memory film 207 is a composite dielectric layer including a blocking layer 204, a charge trapping layer 206, and a tunneling layer 208 from outside to inside in this order in the plan view. In some embodiments, each of blocking layer 204, charge trapping layer 206, and tunneling layer 208 is a continuous layer following the plum blossom shape. The thickness (in the x-y plane) of each of blocking layer 204, charge trapping layer 206, and tunneling layer 208 is nominally uniform in the plan view, according to some embodiments. That is, blocking layer 204 can have a nominally uniform thickness, charge trapping layer 206 can have a nominally uniform thickness, and tunneling layer 208 can have a nominally uniform thickness. It is understood that the thicknesses of blocking layer 204, charge trapping layer 206, and tunneling layer 208 may be nominally the same or different in different examples.

Blocking layer 204 (also known as "blocking oxide") can be formed along the sidewalls of the channel hole and can include silicon oxide, silicon oxynitride, high dielectric constant (high-k) dielectrics, or any combination thereof. In some embodiments, a gate dielectric layer (not shown) is disposed laterally between blocking layer 204 and the gate lines (not shown) or is part of the gate lines in contact with blocking layer 204. For example, the gate dielectric layer may include high-k dielectrics including, but not limited to, aluminum oxide ($Al_2O_3$), hafnium oxide ($HfO_2$), zirconium oxide ($ZnO_2$), tantalum oxide ($Ta_2O_5$), etc.

Charge trapping layer 206 (also known as "storage nitride") can be formed over blocking layer 204, for example, a continuous layer in contact with the entire inside surface of blocking layer 204. In some embodiments, charge trapping layer 206 stores charges, for example, electrons or holes from semiconductor channels 210A, 210B, and 210C. The storage or removal of charge in charge trapping layer 206 can impact the on/off state and/or the conductance of semiconductor channels 210A, 210B, and 210C. Charge trapping layer 206 can include silicon nitride, silicon oxynitride, silicon, or any combination thereof.

Tunneling layer 208 (also known as "tunnel oxide") can be formed over charge trapping layer 206, for example, a continuous layer in contact with the entire inside surface of charge trapping layer 206. Charge trapping layer 206 can be sandwiched between two continuous layers: blocking layer 204 and tunneling layer 208 in the x-y plane. Charges, for example, electrons or holes from semiconductor channels 210A, 210B, and 210C can tunnel through tunneling layer 208 to charge trapping layer 206. Tunneling layer 208 can include silicon oxide, silicon oxynitride, or any combination thereof. In some embodiments, blocking layer 204 includes silicon oxide, charge trapping layer 206 includes silicon nitride, and tunneling layer 208 includes silicon oxide. Memory film 207 thus may be referred to as an "ONO" memory film for charge trapping-type of 3D NAND Flash memory.

As shown in FIG. 2, channel structure 200 further includes three semiconductor channels 210A, 210B, and 210C in three petals 202A, 202B, 202C, respectively, according to some embodiments. In some embodiments, semiconductor channels 210A, 210B, and 210C are separated from one another. Each semiconductor channel 210A, 210B, or 210C can be disposed over part of tunneling layer 208 at a respective apex in petal 202A, 202B, or 202C of the plum blossom shape. That is, each semiconductor channel 210A, 210B, or 210C is disconnected from other semiconductor channels 210A, 210B, and 210C at the edges of the plum blossom shape, according to some embodiments. It is understood that in some examples, semiconductor channel 210A, 210B, or 210C may extend from the apex to the edges of the plum blossom shape, but still be separated from other semiconductor channels 210A, 210B, and 210C by a distance at the edges of the plum blossom shape.

Each semiconductor channels 210A, 210B, or 210C can provide charges, for example, electrons or holes, to charge trap layer 206, tunneling through tunneling layer 208. Each semiconductor channels 210A, 210B, or 210C can include silicon, such as amorphous silicon, polysilicon, or single crystalline silicon. In some embodiments, each semiconductor channels 210A, 210B, or 210C includes polysilicon. As shown in FIG. 2, the thickness (in the x-y plane) of each semiconductor channels 210A, 210B, or 210C is nominally uniform in the plan view, according to some embodiments. The thickness of each semiconductor channel 210A, 210B, or 210C can be between about 10 nm and about 15 nm, such as between 10 nm and 15 nm (e.g., 10 nm, 10.5 nm, 11 nm, 11.5 nm, 12 nm, 12.5 nm, 13 nm, 13.5 nm, 14 nm, 14.5 nm, 15 nm, any range bounded by the lower end by any of these values, or in any range defined by any two of these values).

By separating a continuous semiconductor channel (e.g., 108 in FIG. 1) into separated semiconductor channels 210A, 210B, and 210C at different apices (e.g., in petals 202A, 202B, and 202C, respectively) of the plum blossom shape of channel structure 200, channel structure 200 in FIG. 2 includes three memory cells 212A, 212B, and 212C in the same plane in the plan view, thereby increasing the memory cell density. Each memory cell 212A, 212B, or 212C corresponds to a respective one of petals 202A, 202B, and 202C, according to some embodiments. Like petals 202A, 202B, and 202C, each memory cell 212A, 212B, or 212C can have nominally the same size and shape, and adjacent memory cells 212A, 212B, and 212C can be tilted by nominally the same angle, e.g., 120° in FIG. 2. Each memory cell 212A, 212B, or 212C can include a respective separate semiconductor channel 210A, 210B, or 210C, and three memory cells 212A, 212B, and 212C share continuous blocking layer 204, continuous charge trapping layer 206, and continuous tunneling layer 208 from outside to inside in this order in the plan view. For example, memory cell 212A may include semiconductor channel 210A and parts of blocking layer 204, charge trapping layer 206, and tunneling layer 208 in petal 202A. Similarly, memory cell 212B may include semiconductor channel 210B and parts of blocking layer 204, charge trapping layer 206, and tunneling layer 208 in petal 202B; memory cell 212C may include semiconductor channel 210C and parts of blocking layer 204, charge trapping layer 206, and tunneling layer 208 in petal 202C. Each memory cell 212A, 212B, or 212C can be individually controlled by a respective gate line (not shown).

In some embodiments, channel structure 200 further includes a capping layer 212 filling the remaining space of channel structure 200. Capping layer 212 is in the middle of channel structure 200 and is surrounded by tunneling layer 208 and semiconductor channels 210A, 210B, and 210C in the plan view, according to some embodiments. Capping layer 212 can include dielectrics, such as silicon oxide. It is understood that in some examples, part or the entirety of capping layer 212 may be replaced with an air gap. That is, the remaining space of channel structure 200 may not be filled with capping layer 212 or partially filled with capping layer 212. In some embodiments, channel structure 200 includes blocking layer 204, charge trapping layer 206, tunneling layer 208, semiconductor channel 210A, 210B, or 210C, and capping layer 212 from outside to inside in this order at each apex of the plum blossom shape. In some embodiments, channel structure 200 includes blocking layer 204, charge trapping layer 206, tunneling layer 208, and capping layer 212 from outside to inside in this order at the edges of the plum blossom shape.

Although not shown in FIG. 2, it is understood that any other suitable components may be included as part of the 3D memory device having channel structure 200. For example, local contacts, such as bit line contacts, word line contacts, and source line contacts, may be included in the 3D memory device for metal routing, i.e., electrically connecting memory cells 212A, 212B, and 212C to interconnects (e.g., middle-end-of-line (MEOL) interconnects and back-end-of-line (BEOL) interconnects). For example, each semiconductor channel 210A, 210B, or 210C may be metal routed using bit line contacts from the top surface. In some embodiments, the 3D memory device further includes peripheral circuits, such as any suitable digital, analog, and/or mixed-signal peripheral circuits used for facilitating the operation of memory cells 212A, 212B, and 212C. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Figure 3:
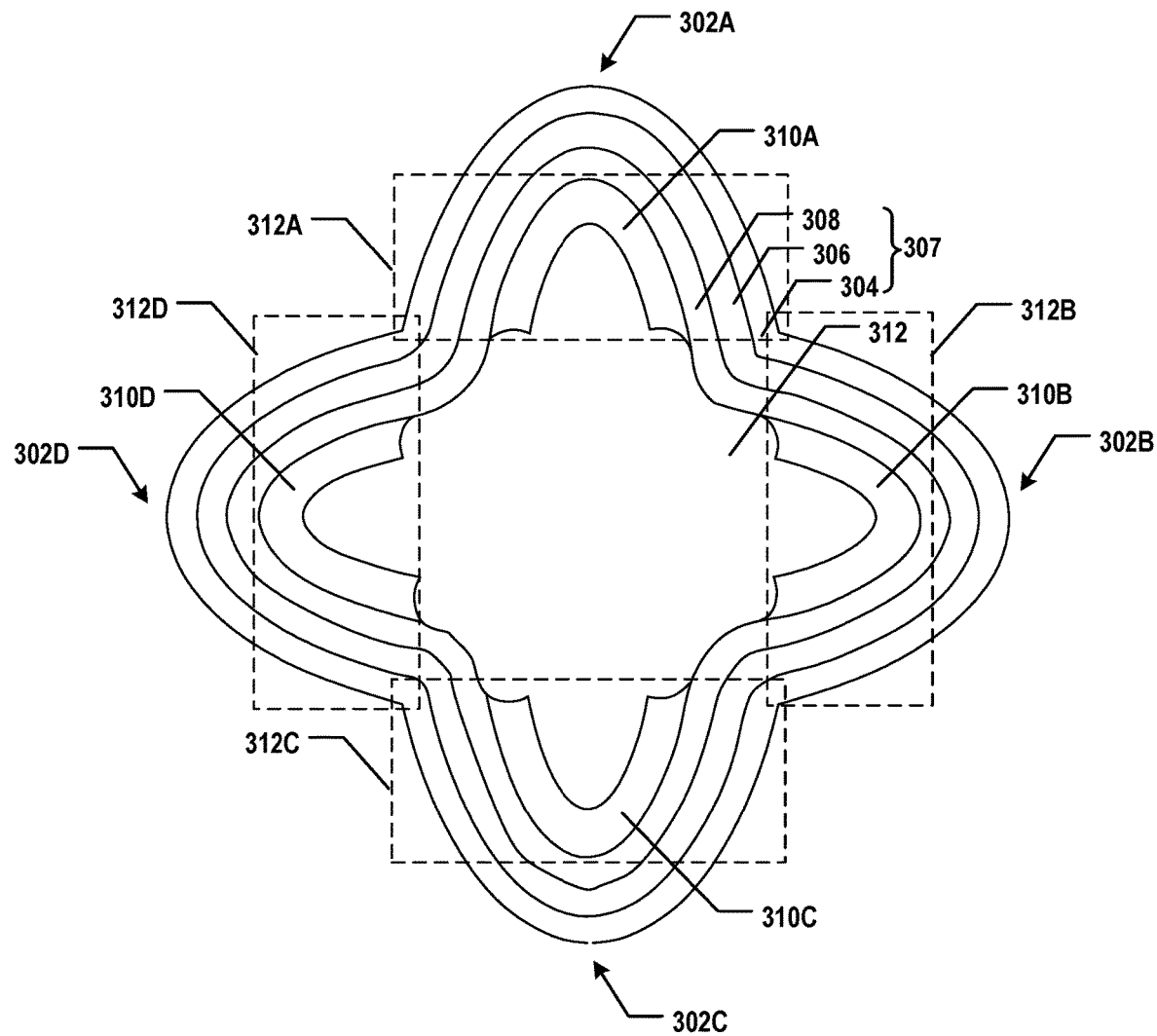
FIG. 3 illustrates a plan view of a cross-section of another exemplary channel structure having a plum blossom shape, according to some embodiments of the present disclosure.
Figure 3:
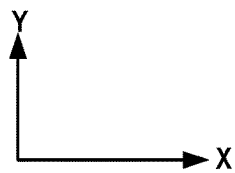

It is understood that although the number of petals 202A, 202B, and 202C and the number of semiconductor channels 210A, 210B, and 210C in FIG. 2 is 3, the number of the petals and the corresponding semiconductor channels therein in channel structures having a plum blossom shape is not limited to 3 and may be any integer greater than 2, such as 3, 4, 5, etc. For example, FIG. 3 illustrates a plan view of a cross-section of another exemplary channel structure 300 having a plum blossom shape, according to some embodiments of the present disclosure. Channel structure 300 is similar to channel structure 200 except for the number of the petals and the corresponding semiconductor channels therein. As shown in FIG. 3, the plum blossom shape of channel structure 300 can include four petals 302A, 302B, 302C, and 302D, and channel structure 300 can include four semiconductor channels 310A, 310B, 310C, and 310D in four petals 302A, 302B, 302C, and 302D, respectively. As a result, channel structure 300 includes four memory cells 312A, 312B, 312C, and 312D in the same plane in the plan view, each of which corresponds to a respective petal 302A, 302B, 302C, or 302D, according to some embodiments. It is understood that the structures, functions, and materials of the similar components that have been described above with respect to channel structure 200 in FIG. 2 may not be repeated in detail for ease of description.

As shown in FIG. 3, channel structure 300 can include a memory film 307 including a continuous blocking layer 304, a continuous charge trapping layer 306, and a continuous tunneling layer 308 each following the plum blossom shape from outside to inside in this order in the plan view. In some embodiments, the thickness of each of blocking layer 304, charge trapping layer 306, and tunneling layer 308 is nominally uniform in the plan view. Channel structure 300 can also include four separate semiconductor channels 310A, 310B, 310C, and 310D each disposed over part of continuous tunneling layer 308 at a respective apex of the plum blossom shape. In some embodiments, the thickness of each semiconductor channel 310A, 310B, 310C, or 310D is nominally uniform in the plan view. For example, the thickness of semiconductor channel 310A, 310B, 310C, or 310D may be between about 10 nm and about 15 nm, such as between 10 nm and 15 nm. In some embodiments, blocking layer 304, charge trapping layer 306, tunneling layer 308, and each semiconductor channel 310A, 310B, 310C, or 310D include silicon oxide, silicon nitride, silicon oxide, and polysilicon, respectively. Each of four memory cells 312A, 312B, 312C, and 312D includes a respective separate semiconductor channel 310A, 310B, 310C or 310C, and four memory cells 312A, 312B, 312C, and 312D share continuous blocking layer 304, continuous charge trapping layer 306, and continuous tunneling layer 308 from outside to inside in this order in the plan view. Channel structure 300 can further include a capping layer 312 filling the remaining space of channel structure 300. Capping layer 312 can be surrounded by tunneling layer 308 and semiconductor channels 310A, 310B, 310C, and 310D in the plan view.

Figure 4:
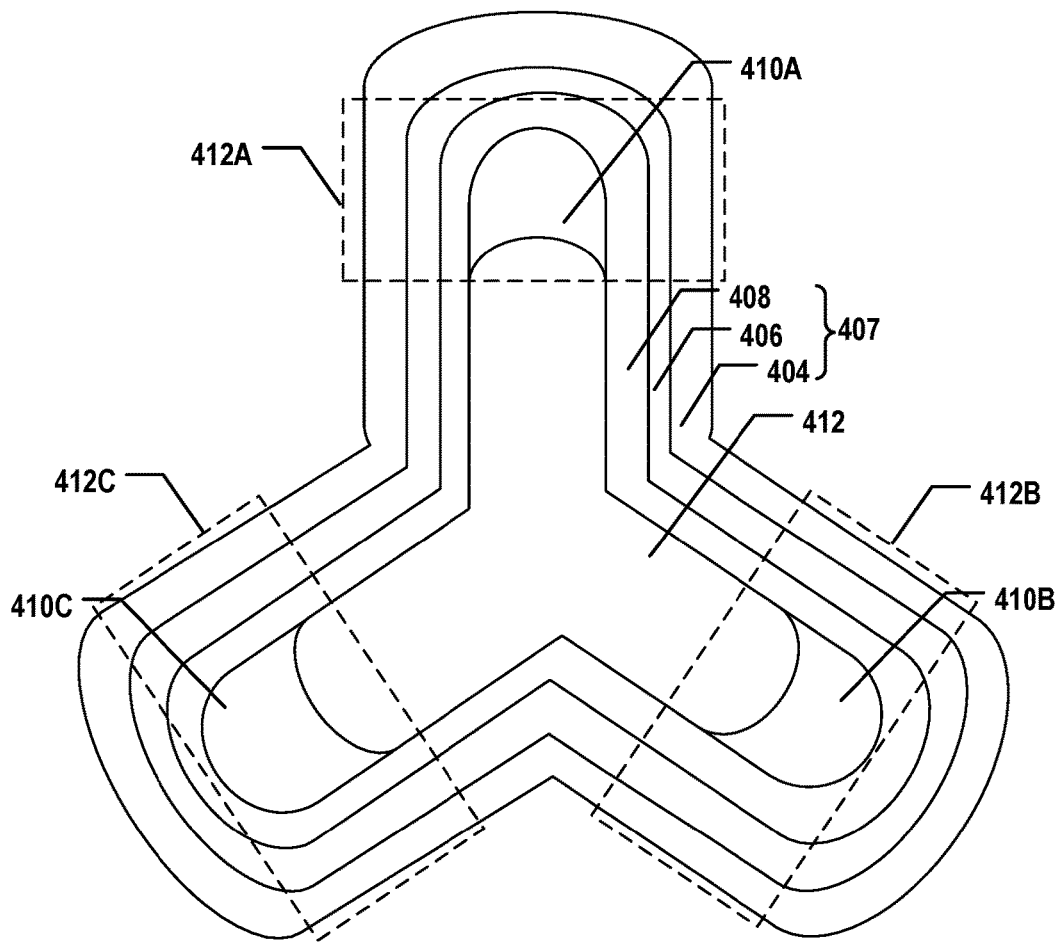
FIG. 4 illustrates a plan view of a cross-section of still another exemplary channel structure having a plum blossom shape, according to some embodiments of the present disclosure.

It is also understood that although the thickness of semiconductor channel in channel structure 300 or 400 is nominally uniform in the plan view, in some examples due to different fabrication processes as described below in detail, the thickness of a semiconductor channel may be nonuniform in the plan view. For example, FIG. 4 illustrates a plan view of a cross-section of still another exemplary channel structure 400 having a plum blossom shape, according to some embodiments of the present disclosure. Channel structure 400 is similar to channel structure 200 except for the thickness uniformity of the semiconductor channels. As shown in FIG. 4, channel structure 400 includes three semiconductor channels 410A, 410B, and 410C, and the thickness of each semiconductor channel 410A, 410B, or 410C is nonuniform in the plan view. For example, the thickness of each semiconductor channel 410A, 410B, or 410C may be greater in the middle and gradually decrease towards the edges thereof. It is understood that the structures, functions, and materials of the similar components that have been described above with respect to channel structure 200 in FIG. 2 may not be repeated in detail for ease of description.

As shown in FIG. 4, channel structure 400 can include a memory film 407 including a continuous blocking layer 404, a continuous charge trapping layer 406, and a continuous tunneling layer 408 each following the plum blossom shape from outside to inside in this order in the plan view. In some embodiments, the thickness of each of blocking layer 404, charge trapping layer 406, and tunneling layer 408 is nominally uniform in the plan view. Channel structure 400 can also include three separate semiconductor channels 410A, 410B, and 410C each disposed over part of continuous tunneling layer 408 at a respective apex of the plum blossom shape. In some embodiments, blocking layer 404, charge trapping layer 406, tunneling layer 408, and each semiconductor channel 410A, 410B, or 410C include silicon oxide, silicon nitride, silicon oxide, and polysilicon, respectively. Each of three memory cells 412A, 412B, and 412C includes a respective separate semiconductor channel 410A, 410B, or 410C, and three memory cells 412A, 412B, and 412C share continuous blocking layer 404, continuous charge trapping layer 406, and continuous tunneling layer 408 from outside to inside in this order in the plan view. Channel structure 400 can further include a capping layer 412 filling the remaining space of channel structure 400. Capping layer 412 can be surrounded by tunneling layer 408 and semiconductor channels 410A, 410B, and 410C in the plan view.

Figure 5:
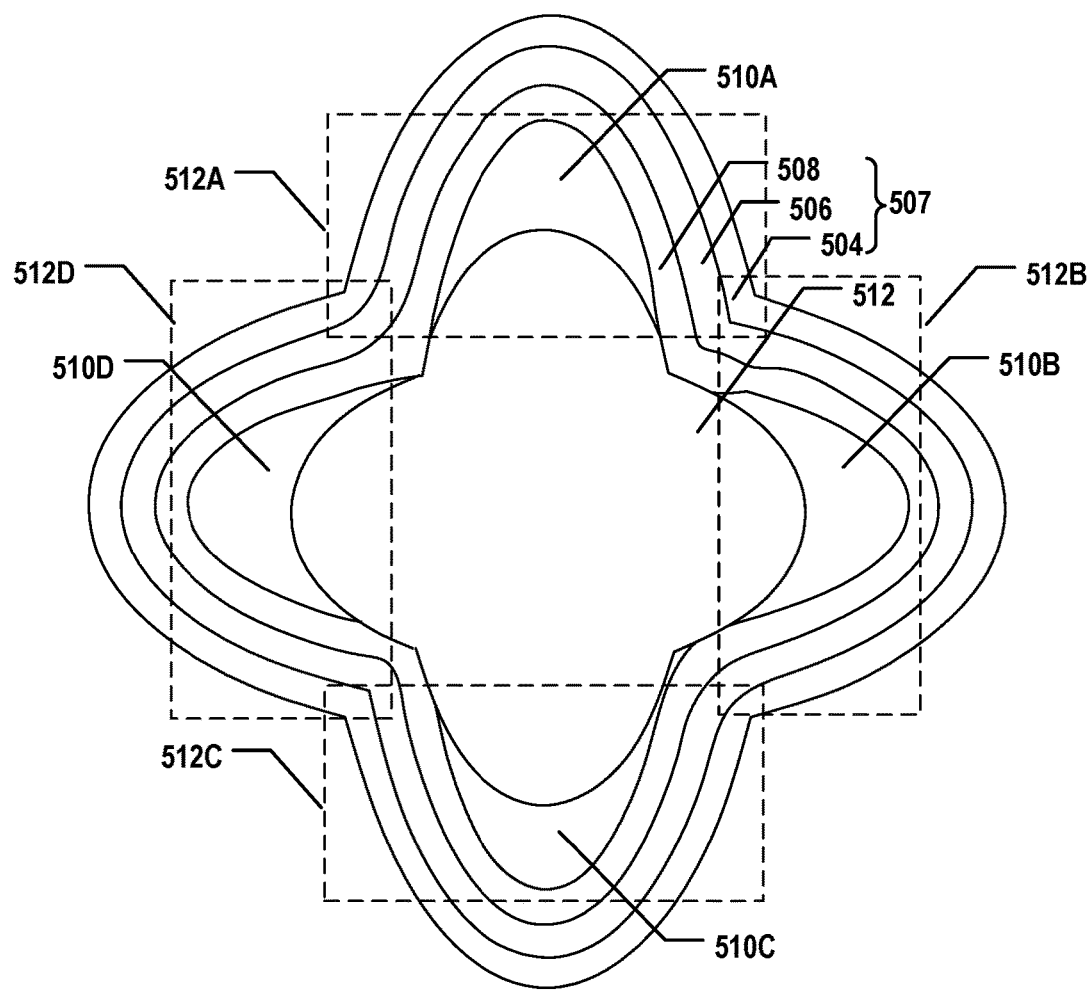
FIG. 5 illustrates a plan view of a cross-section of yet another exemplary channel structure having a plum blossom shape, according to some embodiments of the present disclosure.

FIG. 5 illustrates a plan view of a cross-section of yet another exemplary channel structure 500 having a plum blossom shape, according to some embodiments of the present disclosure. Channel structure 500 is similar to channel structure 300 except for the thickness uniformity of the semiconductor channels. As shown in FIG. 5, channel structure 500 includes four semiconductor channels 510A, 510B, 510C, and 510D, and the thickness of each semiconductor channel 510A, 510B, 510C, or 510D is nonuniform in the plan view. For example, the thickness of each semiconductor channel 510A, 510B, 510C, or 510D may be greater in the middle and gradually decrease towards the edges thereof. It is understood that the structures, functions, and materials of the similar components that have been described above with respect to channel structure 300 in FIG. 3 may not be repeated in detail for ease of description.

As shown in FIG. 5, channel structure 500 can include a memory film 507 including a continuous blocking layer 504, a continuous charge trapping layer 506, and a continuous tunneling layer 508 each following the plum blossom shape from outside to inside in this order in the plan view. In some embodiments, the thickness of each of blocking layer 504, charge trapping layer 506, and tunneling layer 508 is nominally uniform in the plan view. Channel structure 500 can also include four separate semiconductor channels 510A, 510B, 510C, and 510D each disposed over part of continuous tunneling layer 508 at a respective apex of the plum blossom shape. In some embodiments, blocking layer 504, charge trapping layer 506, tunneling layer 508, and each semiconductor channel 510A, 510B, 510C, or 510D include silicon oxide, silicon nitride, silicon oxide, and polysilicon, respectively. Each of four memory cells 512A, 512B, 512C, and 512D includes a respective separate semiconductor channel 510A, 510B, 510C, or 510D, and four memory cells 512A, 512B, 512C, and 512D share continuous blocking layer 504, continuous charge trapping layer 506, and continuous tunneling layer 508 from outside to inside in this order in the plan view. Channel structure 500 can further include a capping layer 512 filling the remaining space of channel structure 500. Capping layer 512 can be surrounded by tunneling layer 508 and semiconductor channels 510A, 510B, 510C, and 510D in the plan view.

Figure 6A:
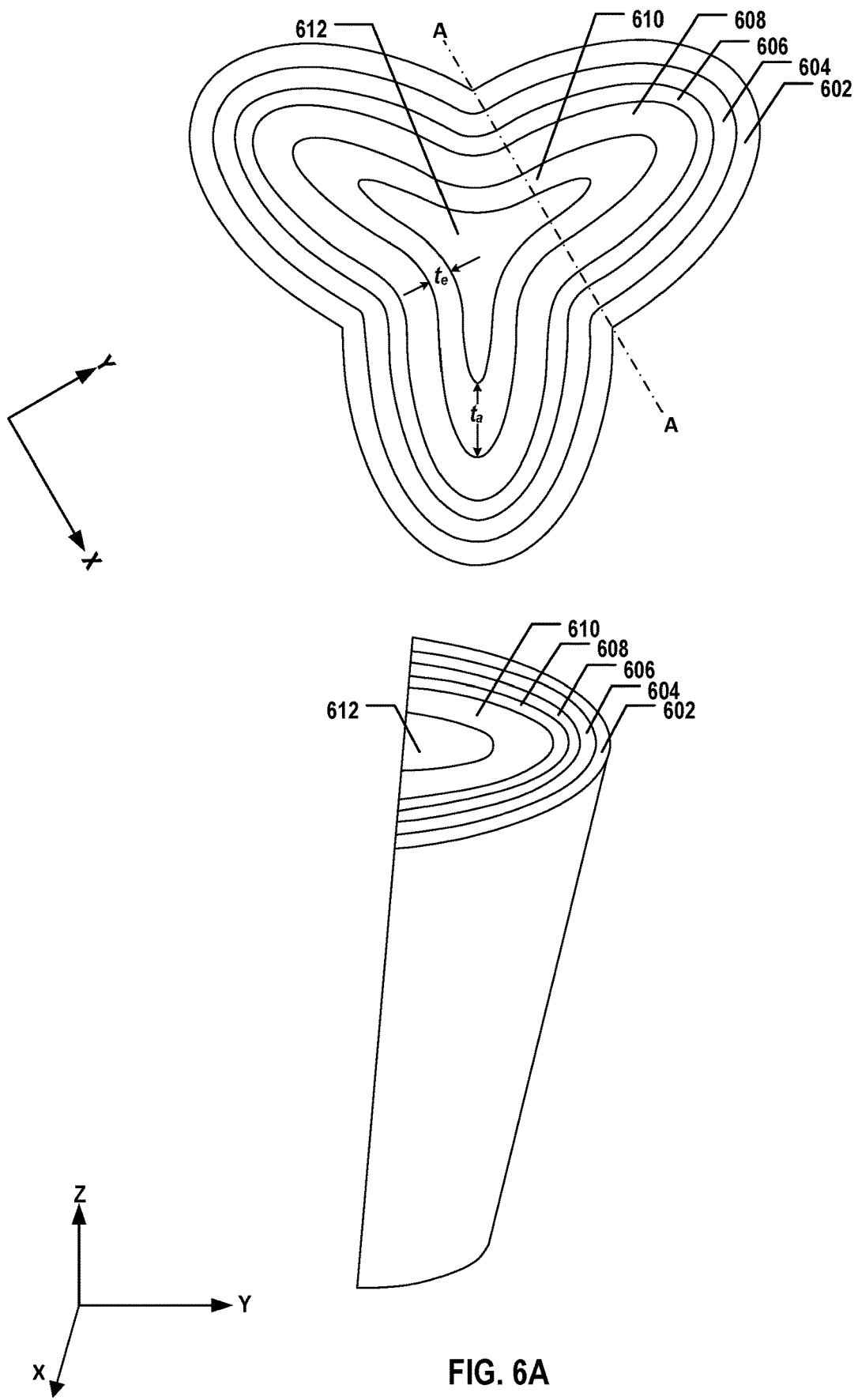
FIGS. 6A-6C illustrate an exemplary fabrication process for forming a channel structure having a plum blossom shape, according to some embodiments of the present disclosure.
Figure 6B:
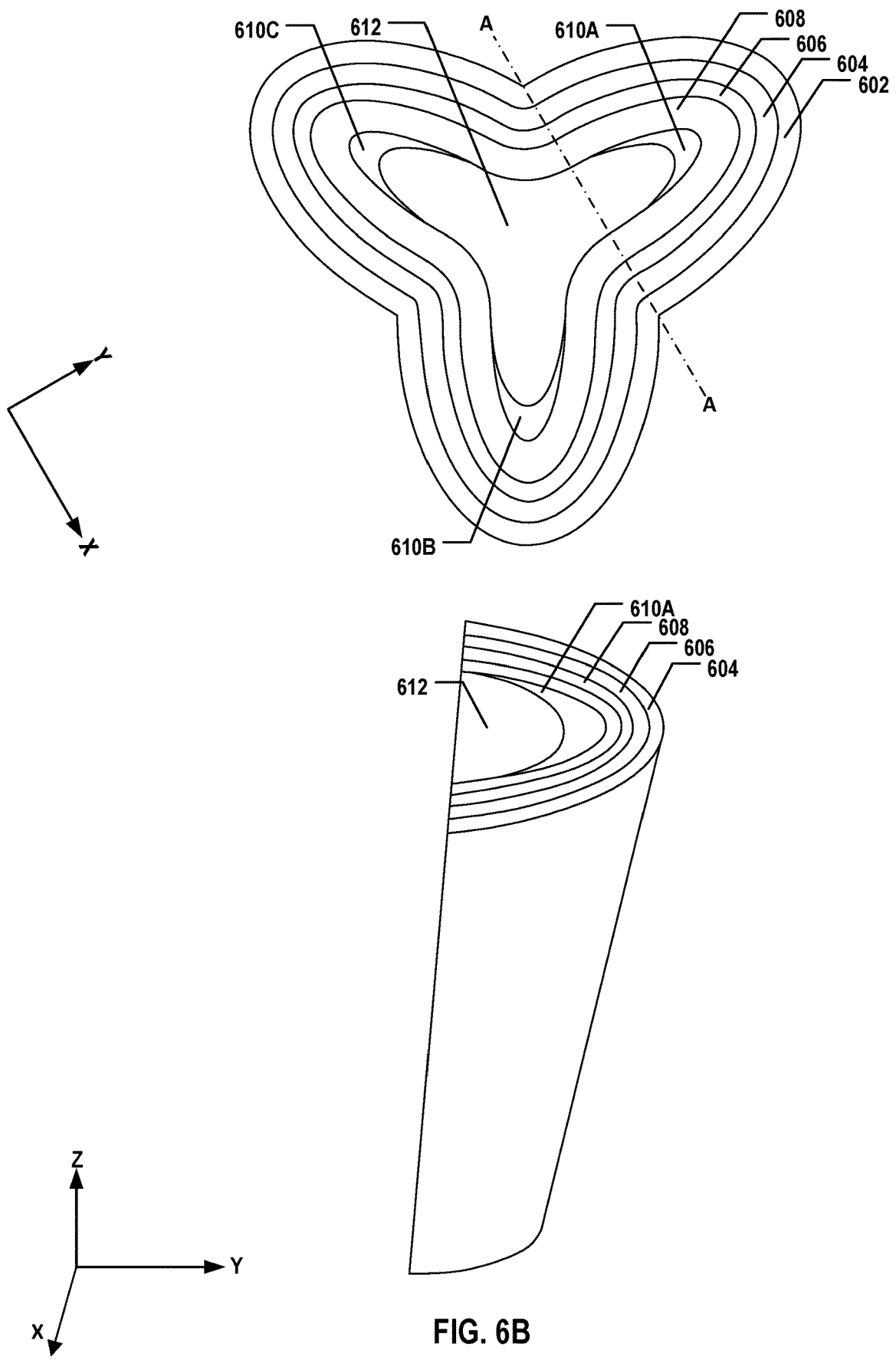
Figure 6C:
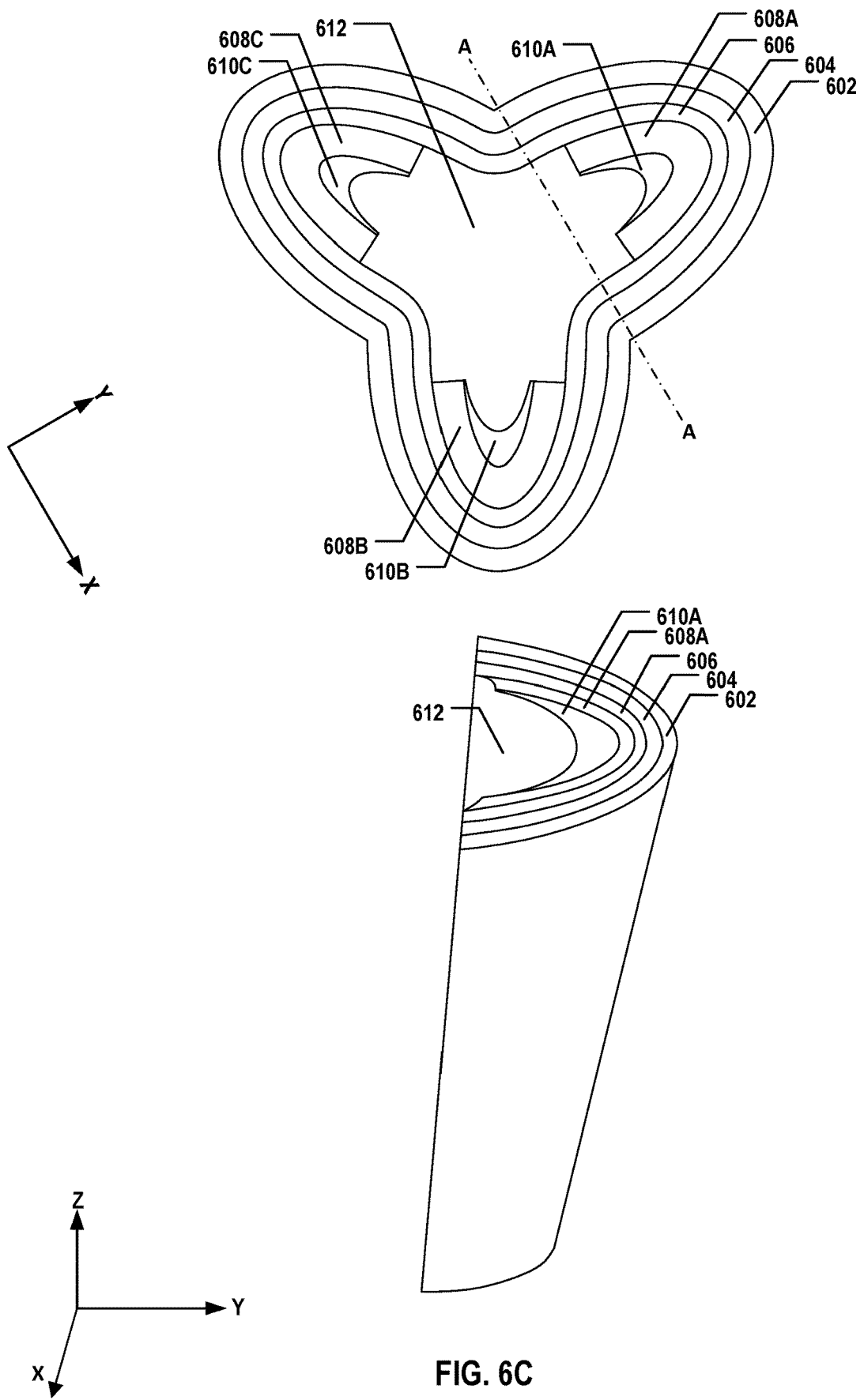
Figure 8:
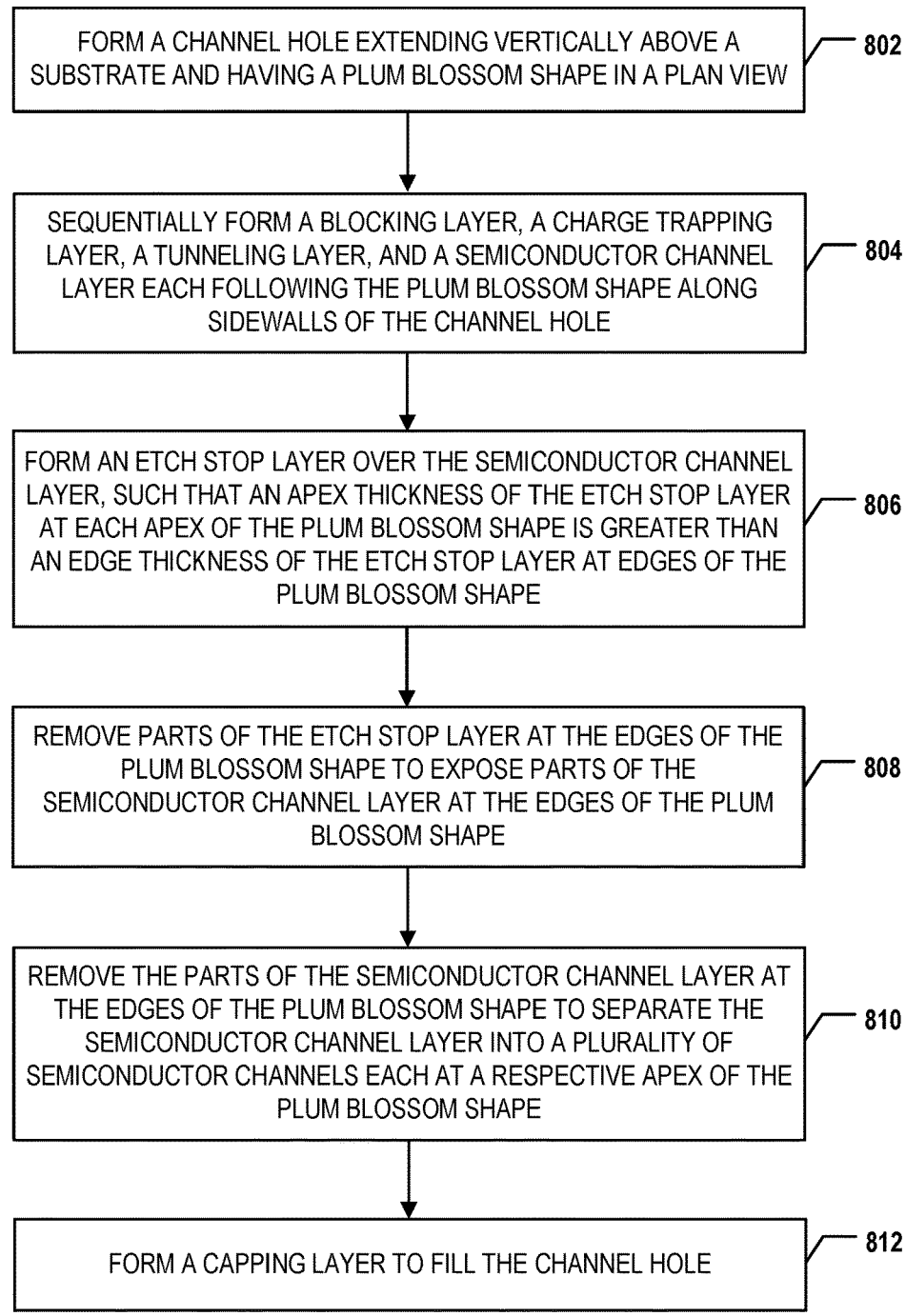
FIG. 8 is a flowchart of an exemplary method for forming a 3D memory device with a channel structure having a plum blossom shape, according to some embodiments.

FIGS. 6A-6C illustrate an exemplary fabrication process for forming a channel structure having a plum blossom shape, according to some embodiments of the present disclosure. Each of FIGS. 6A-6C illustrates a plan view of a cross-section of a respective intermediate structure in forming the channel structure as well as a top perspective view of another cross-section in the AA plane of the intermediate structure. FIG. 8 is a flowchart of an exemplary method 800 for forming a 3D memory device with a channel structure having a plum blossom shape, according to some embodiments. Examples of the 3D memory device depicted in FIGS. 6A-6C and 8 include a 3D memory device having channel structure 200 depicted in FIG. 2. FIGS. 6A-6C and 8 will be described together. It is understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a channel hole extending vertically above a substrate and having a plum blossom shape in a plan view is formed. In some embodiments, the plum blossom shape includes a plurality of petals. The number of the petals is greater than 2, according to some embodiments. The substrate can be a silicon substrate.

As illustrated in FIG. 6A, a channel hole extending vertically and having a plum blossom shape with three petals in the plan view is formed above a substrate (not shown). An etch mask (e.g., a soft etch mask and/or a hard etch mask)

corresponding to the blossom shape of the channel hole can be patterned using lithography, development, and etching. The channel hole then can be etched with the etch mask through a stack structure, either a memory stack including interleaved conductive layers and dielectric layers or a dielectric stack including interleaved sacrificial layers and dielectric layers, using wet etching and/or dry etching, such as deep reactive ion etching (DRIE).

Method 800 proceeds to operation 804, as illustrated in FIG. 8, in which a blocking layer, a charge trapping layer, a tunneling layer, and a semiconductor channel layer each following the plum blossom shape are sequentially formed along sidewalls of the channel hole. Each of the blocking layer, charge trapping layer, tunneling layer, and semiconductor channel layer can be a continuous layer. In some embodiments, to sequentially form the blocking layer, charge trapping layer, tunneling layer, and semiconductor channel layer, layers of silicon oxide, silicon nitride, silicon oxide, and polysilicon are sequentially deposited along the sidewalls of the channel hole. The deposition can include atomic layer deposition (ALD). In some embodiments, the thickness of the semiconductor channel layer is nominally uniform in the plan view, such as between 10 nm and 15 nm.

As illustrated in FIG. 6A, a blocking layer 602, a charge trapping layer 604, a tunneling layer 606, and a semiconductor channel layer 608 are sequentially formed along sidewalls of the channel hole and thus, each follows the plum blossom shape of the channel hole in the plan view. In some embodiments, layers of dielectrics, such as a layer of silicon oxide, a layer of silicon nitride, and a layer of silicon oxide, are sequentially deposited along the sidewalls of the channel hole using one or more thin film deposition processes including, but not limited to, physical vapor deposition (PVD), chemical vapor deposition (CVD), ALD, or any combination thereof to form blocking layer 602, charge trapping layer 604, and tunneling layer 606. A layer of a semiconductor material, such as polysilicon, then can be deposited over the layer of silicon oxide (tunneling layer 606) using one or more thin film deposition processes including, but not limited to, PVD, CVD, ALD, or any combination thereof to form semiconductor channel layer 608. In some embodiments, a conformal coating process, such as ALD, is used to deposit each of blocking layer 602, charge trapping layer 604, tunneling layer 606, and semiconductor channel layer 608, such that each of blocking layer 602, charge trapping layer 604, tunneling layer 606, and semiconductor channel layer 608 can have a nominally uniform thickness in the x-y plane in the plan view. In some embodiments, the thickness of semiconductor channel layer 608 is controlled to be between about 10 nm and about 15 nm, such as between 10 nm and 15 nm, by controlling, for example, the deposition rate and/or time of the ALD.

Method 800 proceeds to operation 806, as illustrated in FIG. 8, in which an etch stop layer is formed over the semiconductor channel layer, such that an apex thickness of the etch stop layer at each apex of the plum blossom shape is greater than an edge thickness of the etch stop layer at edges of the plum blossom shape. In some embodiments, to form the etch stop layer, a layer of silicon oxide is deposited over the semiconductor channel layer using ALD without filling the channel hole.

As illustrated in FIG. 6A, an etch stop layer 610 is formed over semiconductor channel layer 608. The thickness of etch stop layer 610 varies between the apices and the edges of the plum blossom shape, according to some embodiments. In some embodiments, the apex thickness $t_a$ of etch stop layer 610 is greater than the edge thickness $t_e$. A layer of silicon oxide, or any other suitable materials that are different from the material of semiconductor channel layer 608 (e.g., polysilicon), can be deposited over semiconductor channel layer 608 using one or more thin film deposition processes including, but not limited to, PVD, CVD, ALD, or any combination thereof to form etch stop layer 610. In some embodiments, ALD is used to deposit etch stop layer 610 because of its ability to precisely control the thickness of the deposition. In each apex of the plum blossom shape, an "angle effect" can cause more deposited material accumulated at the corner where two edges meet. As a result, the thickness of etch stop layer 610 can become larger at each apex than at the edges. The thickness of etch stop layer 610 can be controlled, for example, by controlling the deposition rate and/or time of ALD to ensure the desired thickness distribution (e.g., $t_a > t_e$) while not filling the channel hole. That is, the total thickness of blocking layer 602, charge trapping layer 604, tunneling layer 606, semiconductor channel layer 608, and etch stop layer 610 may be controlled to leave a gap 612 in the middle of the channel hole, which can act as the passageway for future processes.

Method 800 proceeds to operation 808, as illustrated in FIG. 8, in which parts of the etch stop layer at the edges of the plum blossom shape are removed to expose parts of the semiconductor channel layer at the edges of the plum blossom shape. In some embodiments, to remove the parts of the etch stop layer, the etch stop layer is wet etched until the parts of the etch stop layer at the edges of the plum blossom shape are etched away, leaving a remainder of the etch stop layer at each apex of the plum blossom shape.

As illustrated in FIG. 6B, parts of etch stop layer 610 (shown in FIG. 6A) at the edges of the plum blossom shape are removed to expose parts of semiconductor channel layer 608 at the edges of the plum blossom shape. Etch stop layer 610 can be wet etched using any suitable etchants until the parts of etch stop layer 610 at the edges of the plum blossom shape are etched away, for example, by controlling the etching time, leaving remainder 610A, 610B, and 610C of etch stop layer 610 at each apex of the plum blossom shape. Other etching conditions, such as etchant concentration, temperature, stirring, etc., can be adjusted accordingly to control the suitable stop timing of the wet etching. In some embodiments in which etch stop layer 610 includes silicon oxide, an etchant including hydrofluoric acid is applied through gap 612 to wet etch etch stop layer 610. Due to the thickness difference between $t_a$ and $t_e$, the parts of etch stop layer 610 at the edges can be removed faster than the parts of etch stop layer 610 at the apices. As a result, by controlling the stop timing of wet etching, remainder 610A, 610B, and 610C separated at each apex of the plum blossom shape can be formed from etch stop layer 610 (e.g., with a reduced thickness due to the etching). After the etching, parts of semiconductor channel layer 608 at the edges of the plum blossom shape are exposed, while parts of semiconductor channel layer 608 at the apices of the plum blossom shape are still covered and protected by remainder 610A, 610B, and 610C of etch stop layer 610, according to some embodiments.

Method 800 proceeds to operation 810, as illustrated in FIG. 8, in which the parts of the semiconductor channel layer at the edges of the plum blossom shape are removed to separate the semiconductor channel layer into a plurality of semiconductor channels each at a respective apex of the plum blossom shape. In some embodiments, to remove the parts of the semiconductor channel layer, the semiconductor channel layer is wet etched until being stopped by the remainder of the etch stop layer.

As illustrated in FIG. 6C, the exposed parts of semiconductor channel layer 608 (shown in FIG. 6B) at the edges of the plum blossom shape are removed to separate semiconductor channel layer 608 into three separate semiconductor channels 608A, 608B, and 608C each at a respective apex of the plum blossom shape. Semiconductor channel layer 608 can be wet etched until being stopped by remainder 610A, 610B, and 610C of etch stop layer 610. That is, remainder 610A, 610B, and 610C of etch stop layer 610 can protect semiconductor channels 608A, 608B, and 608C from the wet etching. In some embodiments in which semiconductor channel layer 608 includes polysilicon, an etchant including tetramethylammonium hydroxide (TMAH) is applied through gap 612 to wet etch semiconductor channel layer 608. In some embodiments, the thickness of each semiconductor channel 608A, 608B, or 608C is nominally uniform in the plan view, such as between 10 nm and 15 nm, like semiconductor channel layer 608. A plurality of separate semiconductor channels 608A, 608B, and 608C each disposed over part of continuous tunneling layer 606 at a respective apex of the plum blossom shape are hereby formed, according to some embodiments.

Method 800 proceeds to operation 812, as illustrated in FIG. 8, in which a capping layer is formed to fill the channel hole. As illustrated in FIG. 6C, a layer of silicon oxide, or any other dielectrics, may be deposited into gap 612 to completely fill the channel hole (without air gap) or partially fill the channel hole (with air gap) using one or more thin film deposition processes including, but not limited to, PVD, CVD, ALD, or any combination thereof to form a capping layer (not shown).

Figure 7A:
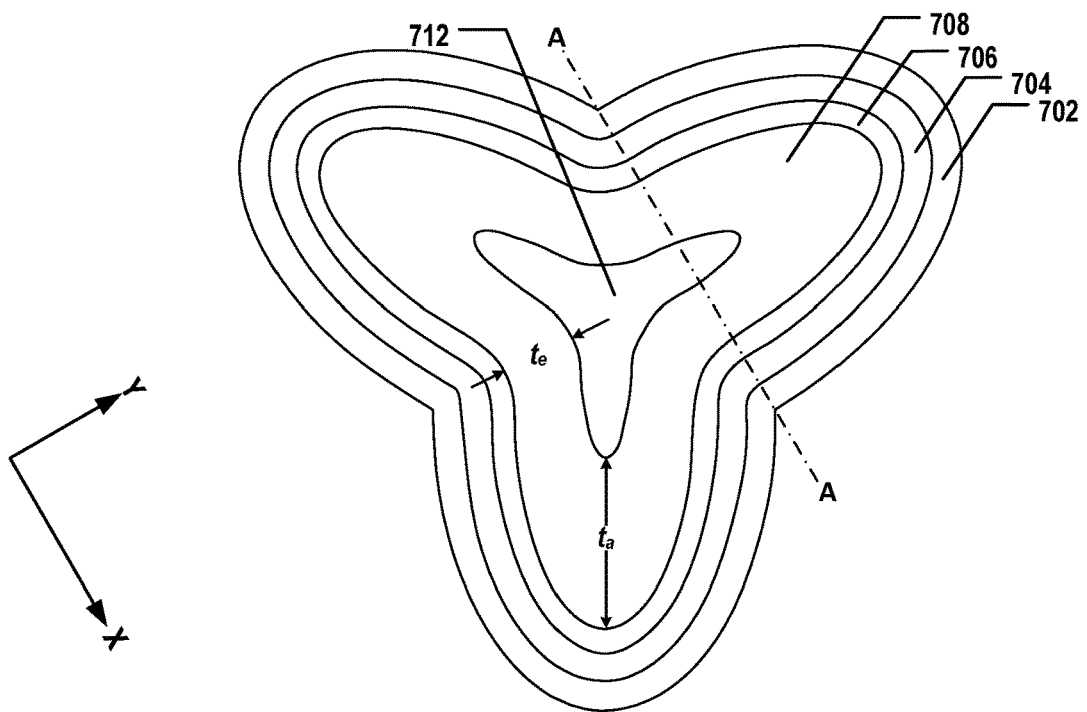
FIGS. 7A and 7B illustrate another exemplary fabrication process for forming a channel structure having a plum blossom shape, according to some embodiments of the present disclosure.
Figure 7A:
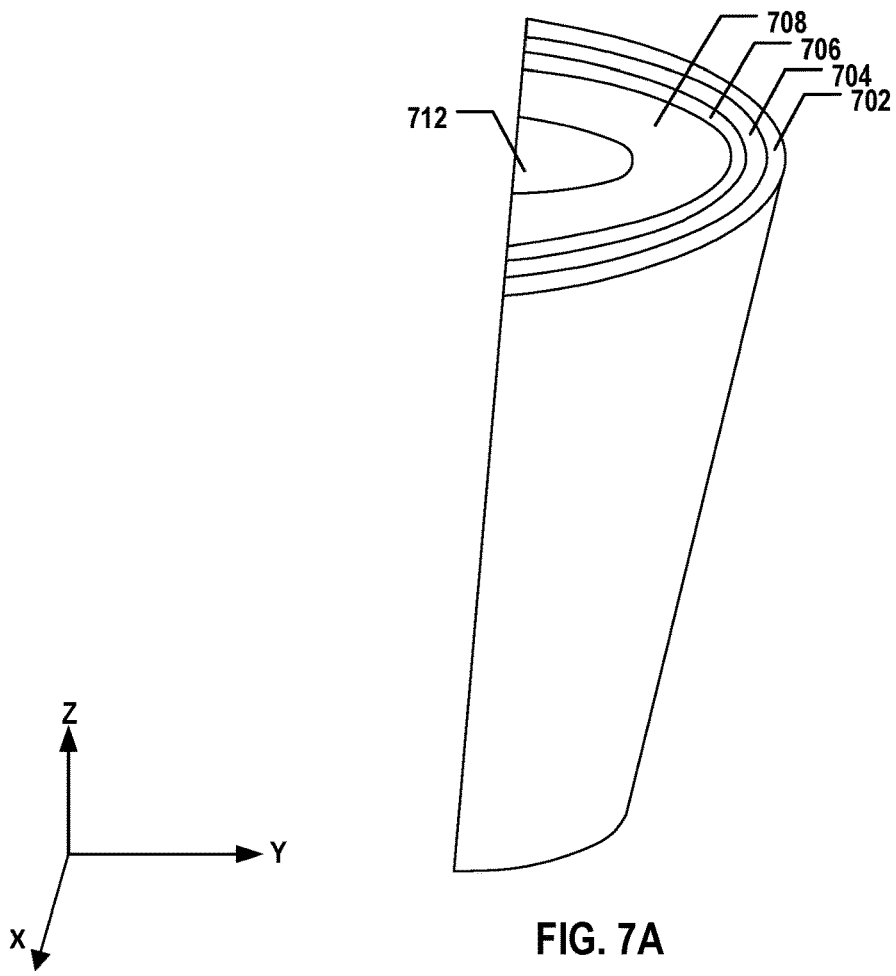
Figure 7B:
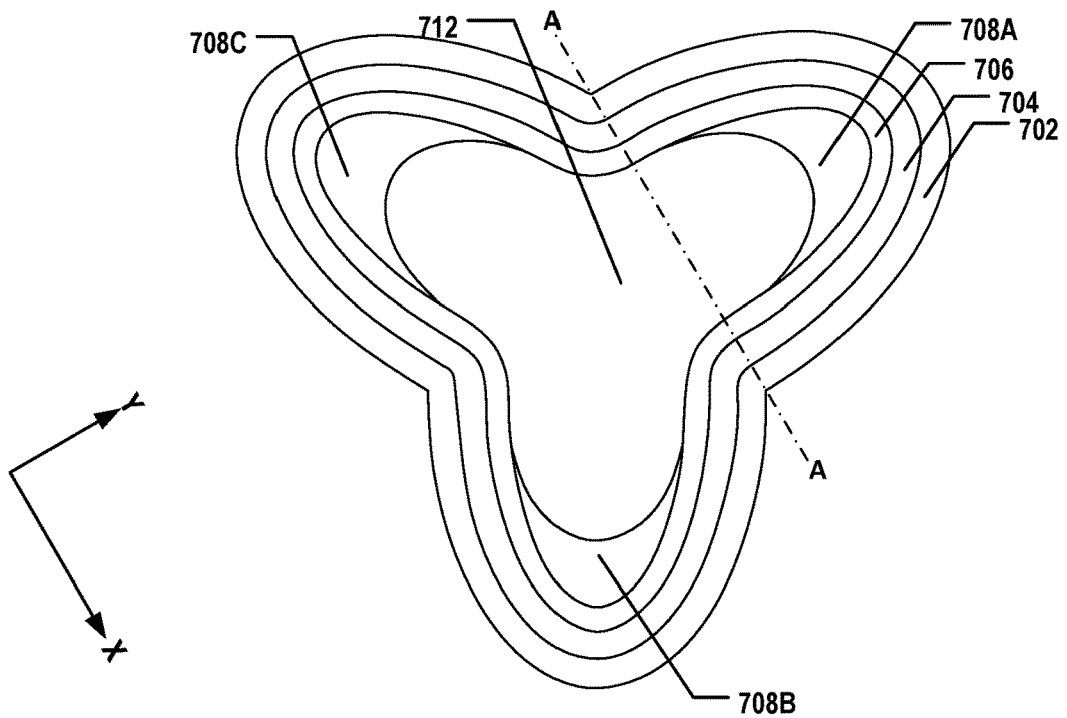
Figure 7B:
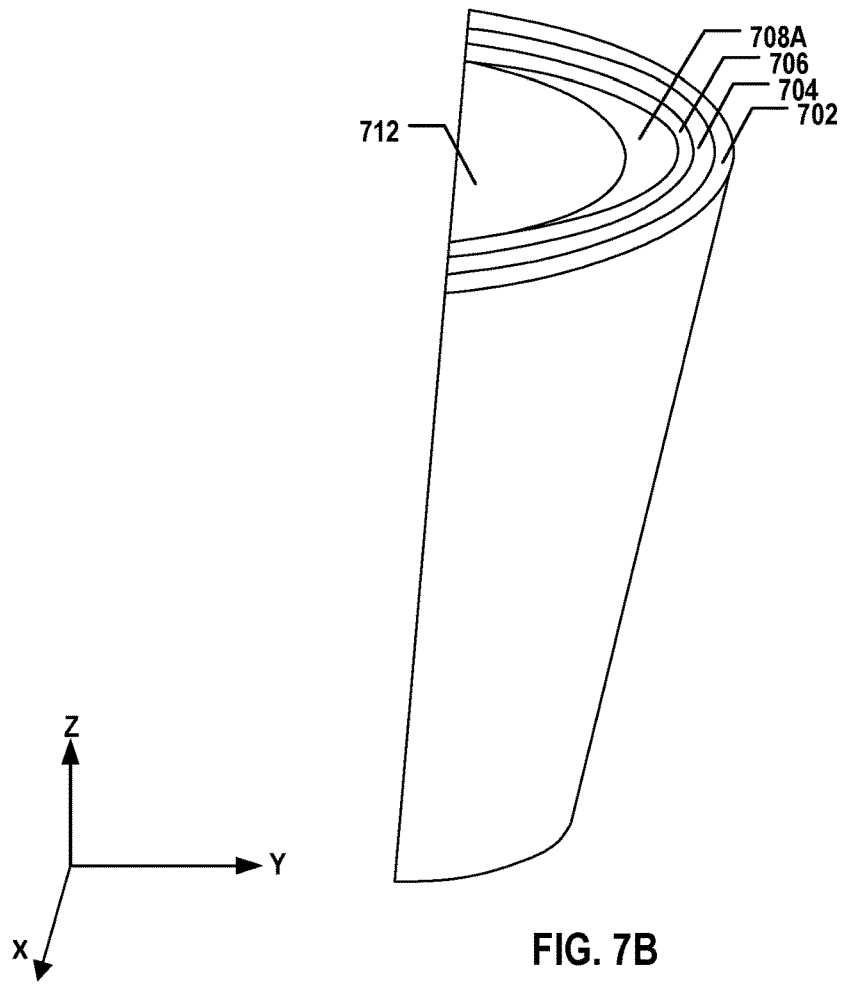
Figure 9:
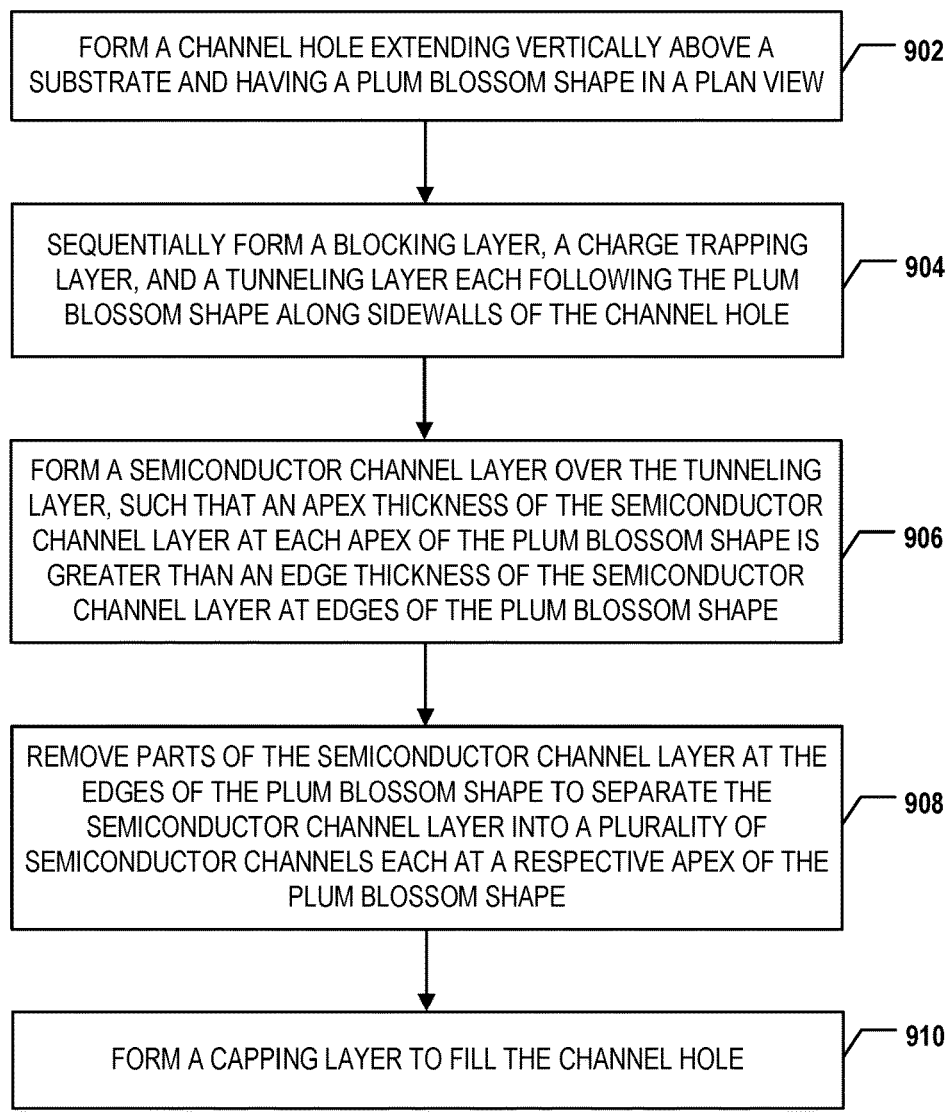
FIG. 9 is a flowchart of another exemplary method for forming a 3D memory device with a channel structure having a plum blossom shape, according to some embodiments.

FIGS. 7A and 7B illustrate another exemplary fabrication process for forming a channel structure having a plum blossom shape, according to some embodiments of the present disclosure. Each of FIGS. 7A and 7B illustrates a plan view of a cross-section of a respective intermediate structure in forming the channel structure as well as a top perspective view of another cross-section in the AA plane of the intermediate structure. FIG. 9 is a flowchart of another exemplary method 900 for forming a 3D memory device with a channel structure having a plum blossom shape, according to some embodiments. Examples of the 3D memory device depicted in FIGS. 7A, 7B, and 9 include a 3D memory devices having channel structure 400 depicted in FIG. 4. FIGS. 7A, 7B, and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a channel hole extending vertically above a substrate and having a plum blossom shape in a plan view is formed. In some embodiments, the plum blossom shape includes a plurality of petals. The number of the petals is greater than 2, according to some embodiments. The substrate can be a silicon substrate.

As illustrated in FIG. 7A, a channel hole extending vertically and having a plum blossom shape with three petals in the plan view is formed above a substrate (not shown). An etch mask (e.g., a soft etch mask and/or a hard etch mask) corresponding to the blossom shape of the channel hole can be patterned using lithography, development, and etching. The channel hole then can be etched with the etch mask through a stack structure, either a memory stack including interleaved conductive layers and dielectric layers or a dielectric stack including interleaved sacrificial layers and dielectric layers, using wet etching and/or dry etching, such as DRIE.

Method 900 proceeds to operation 904, as illustrated in FIG. 9, in which a blocking layer, a charge trapping layer, and a tunneling layer each following the plum blossom shape are sequentially formed along sidewalls of the channel hole. Each of the blocking layer, charge trapping layer, and tunneling layer can be a continuous layer. In some embodiments, to sequentially form the blocking layer, charge trapping layer, and tunneling layer, layers of silicon oxide, silicon nitride, and silicon oxide are sequentially deposited along the sidewalls of the channel hole. The deposition can include ALD.

As illustrated in FIG. 7A, a blocking layer 702, a charge trapping layer 704, and a tunneling layer 706 are sequentially formed along sidewalls of the channel hole and thus, each follows the plum blossom shape of the channel hole in the plan view. In some embodiments, layers of dielectrics, such as a layer of silicon oxide, a layer of silicon nitride, and a layer of silicon oxide, are sequentially deposited along the sidewalls of the channel hole using one or more thin film deposition processes including, but not limited to, PVD, CVD, ALD, or any combination thereof to form blocking layer 702, charge trapping layer 704, and tunneling layer 706. In some embodiments, a conformal coating process, such as ALD, is used to deposit each of blocking layer 702, charge trapping layer 704, and tunneling layer 706, such that each of blocking layer 702, charge trapping layer 704, and tunneling layer 706 can have a nominally uniform thickness in the x-y plane in the plan view.

Method 900 proceeds to operation 906, as illustrated in FIG. 9, a semiconductor channel layer is formed over the tunneling layer, such that an apex thickness of the semiconductor channel layer at each apex of the plum blossom shape is greater than an edge thickness of the semiconductor channel layer at edges of the plum blossom shape. In some embodiments, to form the etch stop layer, a layer of polysilicon is deposited over the tunneling layer using ALD without filling the channel hole.

As illustrated in FIG. 7A, a semiconductor channel layer 708 is formed over tunneling layer 706. The thickness of semiconductor channel layer 708 varies between the apices and the edges of the plum blossom shape, according to some embodiments. In some embodiments, the apex thickness $t_a$ of semiconductor channel layer 708 is greater than the edge thickness $t_e$. A layer of polysilicon, or any other suitable semiconductor materials, can be deposited over tunneling layer 706 using one or more thin film deposition processes including, but not limited to, PVD, CVD, ALD, or any combination thereof to form semiconductor channel layer 708. In some embodiments, ALD is used to deposit semiconductor channel layer 708 because of its ability to precisely control the thickness of the deposition. In each apex of the plum blossom shape, the angle effect can cause more deposited material accumulated at the corner where two edges meet. As a result, the thickness of semiconductor channel layer 708 can become larger at each apex than at the edges. The thickness of semiconductor channel layer 708 can be controlled, for example, by controlling the deposition rate and/or time of ALD to ensure the desired thickness distribution (e.g., $t_a > t_e$) while not filling the channel hole. That is, the total thickness of blocking layer 702, charge trapping layer 704, tunneling layer 706, and semiconductor channel layer 708 may be controlled to leave a gap 712 in the middle of the channel hole, which can act as the passageway for future processes.

Method 900 proceeds to operation 908, as illustrated in FIG. 9, in which parts of the semiconductor channel layer at the edges of the plum blossom shape are removed to separate the semiconductor channel layer into a plurality of semiconductor channels each at a respective apex of the plum blossom shape. In some embodiments, to remove the parts of the semiconductor channel layer, the semiconductor channel layer is wet etched or dry etched until the parts of the semiconductor channel layer at the edges of the plum blossom shape are etched away, leaving a remainder of the semiconductor channel layer at each apex of the plum blossom shape.

As illustrated in FIG. 7B, parts of semiconductor channel layer 708 (shown in FIG. 7A) at the edges of the plum blossom shape are removed to separate semiconductor channel layer 708 into three separate semiconductor channels 708A, 708B, and 708C each at a respective apex of the plum blossom shape. Semiconductor channel layer 708 can be wet etched or dry etched until the parts of semiconductor channel layer 708 at the edges of the plum blossom shape are etched away, for example, by controlling the etching time, leaving semiconductor channels 708A, 708B, and 708C at each apex of the plum blossom shape. Other etching conditions, such as etchant concentration, temperature, stirring, etc. for wet etching, or power, pressure, flow rate, etc. for dry etching, can be adjusted accordingly to control the suitable stop timing of the etching. In some embodiments in which semiconductor channel layer 708 includes polysilicon, an etchant including TMAH is applied through gap 712 to wet etch semiconductor channel layer 708. In some embodiments, DRIE is applied to dry etch semiconductor channel layer 708. Due to the thickness difference between $t_a$ and $t_e$, the parts of semiconductor channel layer 708 at the edges can be removed faster than semiconductor channels 708A, 708B, and 708C at the apices. As a result, by controlling the stop timing of wet/dry etching, semiconductor channels 708A, 708B, and 708C separated at each apex of the plum blossom shape can be formed from semiconductor channel layer 708 (e.g., with a reduced thickness due to the etching). A plurality of separate semiconductor channels 708A, 708B, and 708C each disposed over part of continuous tunneling layer 706 at a respective apex of the plum blossom shape are hereby formed, according to some embodiments.

Method 900 proceeds to operation 910, as illustrated in FIG. 9, in which a capping layer is formed to fill the channel hole. As illustrated in FIG. 7B, a layer of silicon oxide, or any other dielectrics, may be deposited into gap 712 to completely fill the channel hole (without air gap) or partially fill the channel hole (with air gap) using one or more thin film deposition processes including, but not limited to, PVD, CVD, ALD, or any combination thereof to form a capping layer (not shown).

According to one aspect of the present disclosure, a 3D memory device includes a substrate and a channel structure extending vertically above the substrate and having a plum blossom shape including a plurality of petals in a plan view. The channel structure includes a plurality of semiconductor channels in the plurality of petals, respectively.

In some embodiments, a number of the petals or the semiconductor channels is greater than 2.

In some embodiments, the plurality of semiconductor channels are separated from one another.

In some embodiments, a thickness of each of the semiconductor channels is nominally uniform in the plan view. In some embodiments, the thickness of the semiconductor channel is between about 10 nm and about 15 nm.

In some embodiments, a thickness of each of the semiconductor channels is nonuniform in the plan view.

In some embodiments, the channel structure further includes a blocking layer, a charge trapping layer, and a tunneling layer from outside to inside in this order in the plan view, and each of the blocking layer, charge trapping layer, and tunneling layer is a continuous layer following the plum blossom shape of the channel structure.

In some embodiments, a thickness of each of the blocking layer, charge trapping layer, and tunneling layer is nominally uniform in the plan view.

In some embodiments, each of the semiconductor channels is disposed over part of the tunneling layer at an apex of a respective one of the petals.

In some embodiments, the 3D memory device further includes a capping layer filling a remaining space of the channel structure.

In some embodiments, the blocking layer, charge trapping layer, and tunneling layer include silicon oxide, silicon nitride, and silicon oxide, respectively.

In some embodiments, each of the semiconductor channels includes polysilicon.

According to another aspect of the present disclosure, a 3D memory device includes a continuous blocking layer, a continuous charge trapping layer, and a continuous tunneling layer each following a plum blossom shape from outside to inside in this order in a plan view. The 3D memory device also includes a plurality of separate semiconductor channels each disposed over part of the continuous tunneling layer at a respective apex of the plum blossom shape.

In some embodiments, the blocking layer, charge trapping layer, tunneling layer, and each semiconductor channel include silicon oxide, silicon nitride, silicon oxide, and polysilicon, respectively.

In some embodiments, a number of the semiconductor channels is greater than 2.

In some embodiments, a thickness of each of the blocking layer, charge trapping layer, and tunneling layer is nominally uniform in the plan view.

In some embodiments, a thickness of each of the semiconductor channels is nominally uniform in the plan view. In some embodiments, the thickness of the semiconductor channel is between about 10 nm and about 15 nm.

In some embodiments, a thickness of each of the semiconductor channels is nonuniform in the plan view.

In some embodiments, the 3D memory device includes a capping layer surrounded by the tunneling layer and the semiconductor channels in the plan view.

According to still another aspect of the present disclosure, a 3D memory device includes a substrate and a channel structure extending vertically above the substrate and including more than two memory cells in a same plane in a plan view. Each of the memory cells includes a separate semiconductor channel, and the memory cells share a continuous blocking layer, a continuous charge trapping layer, and a continuous tunneling layer from outside to inside in this order in the plan view.

In some embodiments, the blocking layer, charge trapping layer, tunneling layer, and semiconductor channel include silicon oxide, silicon nitride, silicon oxide, and polysilicon, respectively.

In some embodiments, the channel structure has a plum blossom shape including a plurality of petals in the plan view, and each of the memory cells corresponds to a respective one of the plurality of petals.

In some embodiments, each of the semiconductor channels is disposed over part of the tunneling layer at an apex of a respective petal.

In some embodiments, each of the memory cells has a nominally same size and shape.

In some embodiments, adjacent ones of the memory cells are tilted by a nominally same angle.

In some embodiments, a thickness of each of the blocking layer, charge trapping layer, and tunneling layer is nominally uniform in the plan view.

In some embodiments, a thickness of each of the semiconductor channels is nominally uniform in the plan view. In some embodiments, the thickness of the semiconductor channel is between about 10 nm and about 15 nm.

In some embodiments, a thickness of each of the semiconductor channels is nonuniform in the plan view.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate; and
a channel structure extending vertically above the substrate and having a plum blossom shape comprising a plurality of petals in a plan view,
wherein the channel structure comprises:
a blocking layer, a charge trapping layer, and a tunneling layer from outside to inside in this order in the plan view following the plum blossom shape of the channel structure;
a plurality of semiconductor channels in the plurality of petals, respectively; and
a capping layer fully filling a remaining space of the channel structure,
wherein with the capping layer fully filling the remaining space of the channel structure, each of the blocking layer, the charge trapping layer, and the tunneling layer is continuous and nominally uniform in the plan view,
wherein the capping layer comprises a plurality of parts that extend into the plurality of petals, respectively, and
wherein each part of the capping layer extending into a respective petal comprises:
a first portion extending into and surrounded by a respective one of the plurality of semiconductor channels in the respective petal; and
a second portion surrounded by and in contact with a part of the tunneling layer in the respective petal, wherein a width of the first portion is smaller than or equal to a width of the second portion in the plan view.

2. The 3D memory device of claim 1, wherein a number of the petals or the semiconductor channels is greater than 2.

3. The 3D memory device of claim 1, wherein the plurality of semiconductor channels are separated from one another.

4. The 3D memory device of claim 1, wherein a thickness of each of the semiconductor channels is nominally uniform in the plan view.

5. The 3D memory device of claim 4, wherein the thickness of the semiconductor channel is between about 10 nm and about 15 nm.

6. The 3D memory device of claim 1, wherein a thickness of each of the semiconductor channels is nonuniform in the plan view.

7. The 3D memory device of claim 1, wherein each of the semiconductor channels is disposed over part of the tunneling layer at an apex of the respective petal.

8. The 3D memory device of claim 1, wherein the blocking layer, charge trapping layer, and tunneling layer comprise silicon oxide, silicon nitride, and silicon oxide, respectively.

9. The 3D memory device of claim 1, wherein each of the semiconductor channels comprises polysilicon.

10. The 3D memory device of claim 1, wherein the width of the second portion of each part of the capping layer in the respective petal is nominally uniform in the plan view.

11. The 3D memory device of claim 1, wherein:
the channel structure further comprises a plurality of remainders of an etch stop layer following the plurality of semiconductor channels in the plurality of petals, respectively; and
the first portion of each part of the capping layer in the respective petal is further surrounded by and in contact with a respective one of the plurality of remainders of the etch stop layer in the respective petal.

12. A three-dimensional (3D) memory device, comprising:
a continuous blocking layer, a continuous charge trapping layer, and a continuous tunneling layer each following a plum blossom shape comprising a plurality of petals from outside to inside in this order in a plan view;
a plurality of separate semiconductor channels each disposed over part of the continuous tunneling layer at a respective apex of the plum blossom shape; and
a capping layer fully filling a remaining space of the plum blossom shape,
wherein with the capping layer fully filling the remaining space of the plum blossom shape, each of the blocking layer, the charge trapping layer, and the tunneling layer is continuous and nominally uniform in the plan view, wherein the capping layer comprises a plurality of parts that extend into the plurality of petals, respectively, and wherein each part of the capping layer extending into a respective petal comprises:
- a first portion extending into and surrounded by a respective one of the plurality of semiconductor channels in the respective petal; and
- a second portion surrounded by and in contact with a part of the tunneling layer in the respective petal, wherein a width of the first portion is smaller than or equal to a width of the second portion in the plan view.

13. The 3D memory device of claim 12, wherein a thickness of each of the semiconductor channels is nominally uniform in the plan view.

14. The 3D memory device of claim 12, wherein a thickness of each of the semiconductor channels is nonuniform in the plan view.

15. The 3D memory device of claim 12, wherein the capping layer is surrounded by the tunneling layer and the semiconductor channels in the plan view.

16. A three-dimensional (3D) memory device, comprising:
   a substrate; and
   a channel structure extending vertically above the substrate and comprising more than two memory cells in a same plane in a plan view,
   wherein each of the memory cells comprises a separate semiconductor channel, and the memory cells share a continuous blocking layer, a continuous charge trapping layer, and a continuous tunneling layer from outside to inside in this order in the plan view,
   wherein the memory cells share a capping layer fully filling a remaining space of the channel structure,
   wherein with the capping layer fully filling the remaining space of the channel structure, each of the blocking layer, the charge trapping layer, and the tunneling layer is continuous and nominally uniform in the plan view,
   wherein the channel structure has a plum blossom shape comprising a plurality of petals in the plan view, and each of the memory cells corresponds to a respective petal of the plurality of petals,
   wherein the capping layer comprises a plurality of parts that extend into the plurality of petals, respectively, and
   wherein each part of the capping layer extending into the respective petal comprises:
   - a first portion extending into and surrounded by a respective semiconductor channel in the respective petal; and
   - a second portion surrounded by and in contact with a part of the tunneling layer in the respective petal, wherein a width of the first portion is smaller than or equal to a width of the second portion in the plan view.

17. The 3D memory device of claim 16, wherein each of the semiconductor channels is disposed over part of the tunneling layer at an apex of the respective petal.

18. The 3D memory device of claim 16, wherein adjacent ones of the memory cells are tilted by a nominally same angle.

19. The 3D memory device of claim 16, wherein a thickness of each of the semiconductor channels is nominally uniform in the plan view.

20. The 3D memory device of claim 16, wherein a thickness of each of the semiconductor channels is nonuniform in the plan view.

* * * * *